(12) United States Patent
Ikada et al.

(10) Patent No.: US 6,367,133 B2
(45) Date of Patent: Apr. 9, 2002

(54) METHOD OF MANUFACTURING SURFACE ACOUSTIC WAVE APPARATUS

(75) Inventors: Katsuhiro Ikada; Kenji Sakaguchi, both of Ishikawa-ken; Miki Takamiya, Kanazawa, all of (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/799,438

(22) Filed: Mar. 5, 2001

(30) Foreign Application Priority Data

Mar. 15, 2000 (JP) ......................................... 2000-072300

(51) Int. Cl.⁷ ............................................... H01L 41/00
(52) U.S. Cl. ....................... 29/25.35; 310/334; 427/100
(58) Field of Search ......................... 29/25.35; 310/334, 310/313 B; 427/100

(56) References Cited

FOREIGN PATENT DOCUMENTS

| JP | 10-190390 | 7/1998 |
|----|-----------|--------|

*Primary Examiner*—Carl E. Hall
(74) *Attorney, Agent, or Firm*—Keating & Bennett LLP

(57) ABSTRACT

A method of manufacturing a surface acoustic wave apparatus including the steps of forming a first conductive film, depositing a first resist on the first conductive film and patterning the first resist, dry-etching the first conductive film using the patterned first resist to form IDT electrodes, a short-circuit wiring electrode for establishing electrical connection between IDT electrodes, and a second conductive film provided where the second surface acoustic wave device is constructed, removing the second conductive film, depositing a second resist and heating the second resist, patterning the second resist on the electrodes, forming a second conductive film having a thickness which is different from the first conductive film, removing the second resist to form the electrodes of the second surface acoustic wave device and to expose the electrodes of the first surface acoustic wave device, and disconnecting the short-circuit wiring electrode.

17 Claims, 10 Drawing Sheets

METHOD OF MANUFACTURING SURFACE ACOUSTIC WAVE APPARATUS

BACKGROUND OF THE INVENTION

1. Field of the Invention

The present invention relates to methods of manufacturing surface acoustic wave apparatuses constructed by forming a plurality of surface acoustic wave devices having electrode films with different thicknesses on the same piezoelectric substrate, and, for example, relates to a method of manufacturing a surface acoustic wave apparatus in which a plurality of surface acoustic wave filter devices having different bands, are disposed on the piezoelectric substrate.

2. Description of the Related Art

Recently, in mobile communication apparatuses such as mobile phones, the apparatuses that support multi-band transmissions have been considered in order to achieve high-performance. In addition, the transmission frequencies of the mobile phones are getting higher.

Therefore, a mobile phone that can operate at an 800 MHz band as well as one having a 1.5 GHz or greater frequency band requires RF band-pass filters each corresponding to the two different frequency bands.

In order to achieve miniaturization and low overall weight of a terminal apparatus such as this type of a mobile phone, miniaturization of the components mounted therein must be achieved. However, since there is the limit as to how small the components can be, it is strongly desired that a single component perform the functions of the two RF band-pass filters.

In Japanese Unexamined Patent Application Publication No. 10-190390, there is disclosed a method of manufacturing a surface acoustic wave apparatus in which a plurality of surface acoustic wave filter devices are disposed on the same piezoelectric substrate.

Figure 10A:
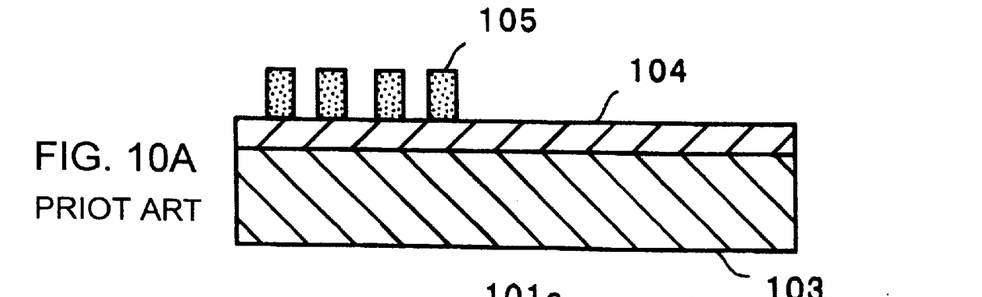
FIGS. 10A to 10E are cross sectional views illustrating the manufacturing method of the conventional surface acoustic wave apparatus.
Figure 10B:
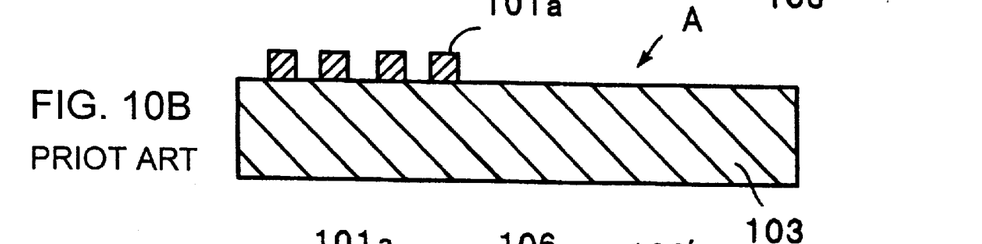
Figure 10C:
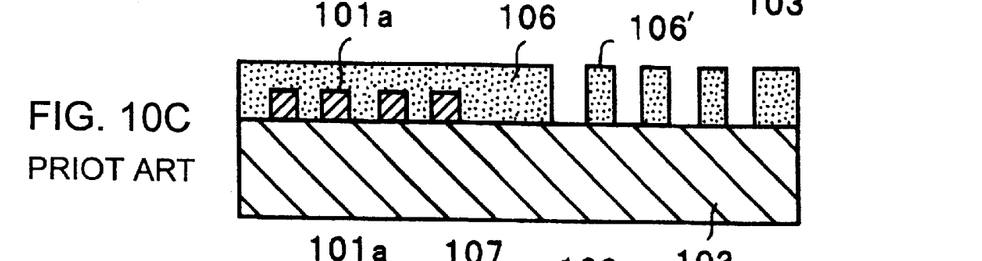
Figure 10D:
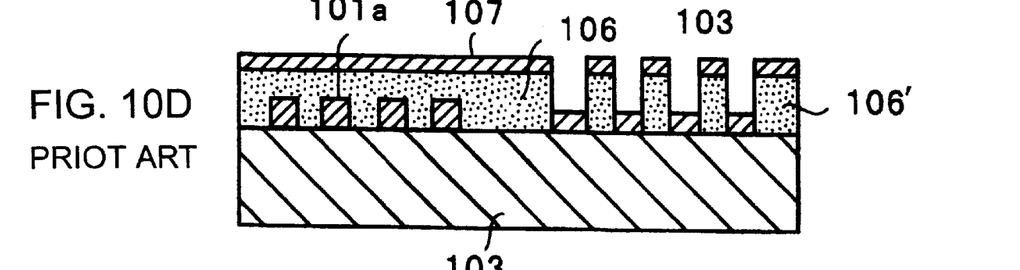
Figure 10E:
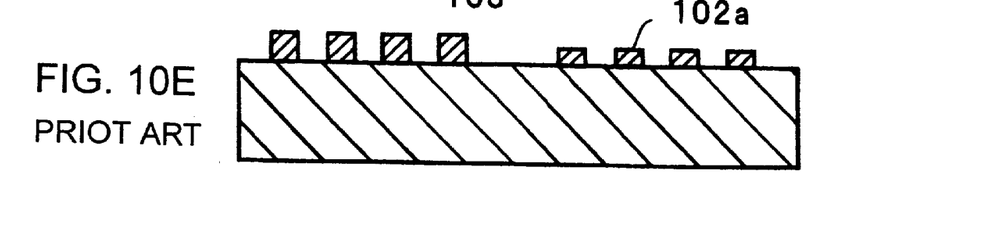

FIGS. 10A to 10E are cross-sectional views illustrating the method of manufacturing the surface acoustic wave apparatus according to the above-described related art. In the method described in this related art, a conductive film 104 is formed on a piezoelectric substrate 103 and then a resist is formed along the entire surface of the conductive film 104. Patterning of the resist is performed to form a resist layer 105 (FIG. 10A). Dry etching forms electrodes 101a of a first surface acoustic wave device (FIG. 10B). Thereafter, deposition of the resist and patterning of the resist form a resist layer 106' at a portion in which a second surface acoustic wave device is provided. In this case, a portion in which the first surface acoustic wave device is provided is coated with a resist layer 106 (FIG. 10C). Furthermore, as shown in FIGS. 10D and 10E, a conductive film 107 is entirely formed and then lift-off is performed on the resist layers 106 and 106', and the conductive film 107 is laminated thereon to form electrodes 102a of the second surface acoustic wave device.

According to this method, in a state in which the electrodes of the first electric component device are protected by the resist, the electrodes of the second electric component device are formed by photolithography or etching. Accordingly, when the electrodes of the first and second electric component devices are formed, high accuracy is not required. Therefore, when this method is used for manufacturing a surface acoustic wave apparatus, even though the width of the electrode fingers are as fine as approximately 1 $\mu$m, the efficiency percentage of manufacturing the apparatus can be increased.

However, in the method described in the related art, dry etching which is performed when the electrodes 101a of a first surface acoustic wave device are initially formed is also performed on a region where a second surface acoustic wave device is constructed on a piezoelectric substrate 103. That is, a region indicated by an arrow A in FIG. 10(b) is also subject to dry etching.

Generally, when dry etching is performed in a case in which an electrode finger pitch is approximately 1 $\mu$m or less, due to a micro loading phenomena, a micro-gap portion is the last to be etched. In the dry etching, after etching is performed on the electrodes, generally over-etching follows.

Therefore, when the electrodes 101a of the first surface acoustic wave device are formed, etching is finished earlier in the region indicated by the arrow A. Accordingly, it takes a longer time for the surface of the piezoelectric substrate of the region indicated by the arrow A to be exposed to the plasma, such as F, which is used when dry etching including over-etching is performed. Since the surface of the substrate indicated by the arrow A is exposed to the plasma for the comparatively longer time, there is a problem that the insertion loss of the second surface acoustic wave device is degraded and VSWR is increased.

Furthermore, since the region indicated by the arrow A is also etched, the area of the etched region is increased. Accordingly, when a plurality of surface acoustic wave apparatuses is constructed from a mother piezoelectric substrate, there is a problem that a variation in the characteristic of the surface acoustic wave apparatus in the mother piezoelectric substrate increases.

In addition, when the manufacturing method according to the above-described related art is applied to a method of manufacturing the surface acoustic wave apparatus using a piezoelectric substrate having pyroelectricity, the following problem arises.

That is, generally, when the resist is deposited, the resist is often heated in order to improve adhesion and resistance to plasma of the resist pattern. However, when the piezoelectric substrate having the pyroelectricity is used, due to a temperature change during heating of the resist, a voltage drop occurs between a pair of comb-shaped electrodes which constitute the IDT electrodes of the first surface acoustic wave device, causing discharge. This discharge sometimes produces pyroelectric destruction in the electrodes. Even though discharge is too small to cause the pyroelectric destruction, the resist is sometimes broken, which causes a short circuit in the IDT electrodes of the first surface acoustic wave device after the lift-off process for constructing the electrodes of the surface acoustic wave device.

SUMMARY OF THE INVENTION

In order to overcome the problems described above, preferred embodiments of the present invention provide a method of manufacturing a surface acoustic wave apparatus which, even when a pyroelectric substrate is used in constructing a plurality of surface acoustic wave devices by forming electrodes having different thicknesses on the same piezoelectric substrate, short circuits or other defects are prevented from occurring, and degradation of the piezoelectric substrate is prevented from occurring in an electrode region of the subsequently formed surface acoustic wave device, and degradation of the insertion loss and degradation of the VSWR characteristics are prevented from occurring.

According to a first preferred embodiment of the present invention, a method of manufacturing a surface acoustic wave apparatus including first and second surface acoustic wave devices having different electrode film thicknesses on a piezoelectric substrate, the method including the steps of providing a piezoelectric substrate, forming a first conductive film on an entire surface of the piezoelectric substrate, depositing a first resist on the entire surface of the first conductive film, performing patterning and dry etching on the first resist to form on the piezoelectric substrate IDT electrodes of the first surface acoustic wave device, a short-circuit wiring electrode for establishing electrical connection between comb-shaped electrodes of the IDT electrodes, and a conductive film provided in a region including the entire area in which the second surface acoustic wave device is constructed, performing wet etching to remove the conductive film provided in the region including the entire area in which the second surface acoustic wave device is constructed, depositing a second resist on the entire surface of the piezoelectric substrate and heating the substrate, removing the second resist at a location in which the electrodes of the second surface acoustic wave device are located, forming a second conductive film having the same film thickness as the electrode film thickness of the second surface acoustic wave device, lifting off the second resist and the second conductive film deposited on the second resist, forming the electrodes of the second surface acoustic wave device while exposing the electrodes of the first surface acoustic wave device, and disconnecting the short-circuit wiring electrode in the first surface acoustic wave device.

A second preferred embodiment of the present application provides a method of manufacturing a surface acoustic wave apparatus including first and second surface acoustic wave devices having different electrode film thicknesses on a piezoelectric substrate, the method including the steps of providing a piezoelectric substrate, depositing a first resist on an entire surface of the piezoelectric substrate, removing the first resist at an area in which electrodes of the first surface acoustic wave device are to be formed and an area in which a wiring electrode for short-circuiting between the comb-shaped electrodes of the IDT electrodes of the first surface acoustic wave device is to be formed, forming a first conductive film having substantially the same film thickness as the electrode film thickness of the first surface acoustic wave device, lifting off the first resist and the first conductive film deposited on the first resist, forming the electrodes of the first surface acoustic wave device and the wiring electrode, depositing a second resist on the entire surface of the piezoelectric substrate and heating the substrate, removing the second resist at an area in which the electrodes of the second surface acoustic wave device are formed, depositing a second conductive film having substantially the same film thickness as the electrode film thickness of the second surface acoustic wave device, lifting off the second resist and the second conductive film deposited on the second resist, forming the electrodes of the second surface acoustic wave device, and disconnecting the short-circuit wiring electrode in the first surface acoustic wave device.

A third preferred embodiment of the present invention provides a method of manufacturing a surface acoustic wave apparatus including first and second surface acoustic wave devices having different electrode film thicknesses on a piezoelectric substrate, the method including the steps of providing a piezoelectric substrate, depositing a first resist on an entire surface of the piezoelectric substrate, removing the first resist at an area in which electrodes of the first and second surface acoustic wave devices are to be formed, forming a first conductive film having substantially the same film thickness as the electrode film thickness of the second surface acoustic wave device, depositing a second resist, removing the second resist at an area in which at least the electrodes of the first surface acoustic wave device are formed, except an area in which the second surface acoustic wave device is constructed, depositing a second conductive film having substantially the same film thickness as the electrode film thickness of the first surface acoustic wave device, and lifting off the first resist, the second resist, and the conductive films laminated thereon at the same time.

It is preferred that a negative-type resist is used as the first resist in the third preferred embodiment of the present invention.

In another modification of the third preferred embodiment of the present invention, a positive-type resist is preferably used as the first resist and the negative-type resist is used as the second resist. In the lift-off process, the separating liquid for separating the first and second resists is shared.

In manufacturing methods of surface acoustic wave apparatuses according to various preferred embodiments of present invention, when first and second surface acoustic wave devices having different electrode film thicknesses are formed on a common piezoelectric substrate, a short-circuit wiring electrode for electrically connecting between input/output terminals of the IDT electrodes and ground terminals is formed while the IDT electrodes of the first surface acoustic wave device are formed. After the IDT electrodes of the second surface acoustic wave filter device are formed, the short-circuit wiring electrode is disconnected. Hence, even though the second resist is deposited and adhesion and resistance to heat of the second resist are increased due to heating, the short circuit in the IDT electrodes of the first surface acoustic wave filter device is positively prevented.

Therefore, while malfunction of the IDT electrodes of the first surface acoustic wave filter device is prevented, the electrodes of the second surface acoustic wave filter can be highly accurately formed.

In the first preferred embodiment of the present invention, when dry etching is performed during formation of the IDT electrodes of the first surface acoustic wave filter device, a piezoelectric substrate portion in which the second surface acoustic wave filter device is formed is protected by the first resist. After the dry etching, a conductive film which is provided at a region including the portion in which the second surface acoustic wave device is formed is removed using a wet etching method. Accordingly, the region in which the second surface acoustic wave filter device of the piezoelectric substrate is formed can be prevented from being subjected to plasma such as F used in the dry etching. This enables the insertion loss and VSWR of the second surface acoustic wave filter device to be reliably and positively prevented from being degraded.

In manufacturing methods according to the second and third preferred embodiments of the present invention, when the first and second surface acoustic wave devices having different electrode film thicknesses are formed on the piezoelectric substrate, formation of the electrodes of the first surface acoustic wave filter device are performed using the lift-off method and the region in which the second surface acoustic wave filter device is formed is protected by the resist. Hence, compared with the conventional method in which the first surface acoustic wave filter device is formed using the dry etching method, degradation of the insertion loss and VSWR of the second surface acoustic wave filter device is reliably prevented.

Furthermore, according to the third preferred embodiment of the present invention, since there is no need to increase the accuracy during the second photolithography process, the heating temperature of the resist can be very low, which prevents the occurrence of pyroelectric destruction. Therefore, since formation of the short-circuit wiring electrode and a disconnection process are not required, simplification of the manufacturing processes can be achieved.

In addition, since the lift-off is simultaneously performed during the last process of which the electrodes of the first and second surface acoustic wave filter devices are formed, simplification of the processes can be achieved.

By causing the polarities of the first and second resists to be different, when patterning is performed on the second resist, deformation of the first resist can be prevented. This increases the electrode accuracy of the first surface acoustic wave filter device.

For the purpose of illustrating the present invention, there is shown in the drawings several forms that are presently preferred, it being understood, however, that the present invention is not limited to the precise arrangements and instrumentalities shown.

Other features, characteristics, elements and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of the present invention are illustrated with reference to drawings, for describing the present invention.

FIGS. 1A to 1F are each cross-sectional views illustrating a method of manufacturing a surface acoustic wave apparatus according to a preferred embodiment of the present invention.

Figure 1A:
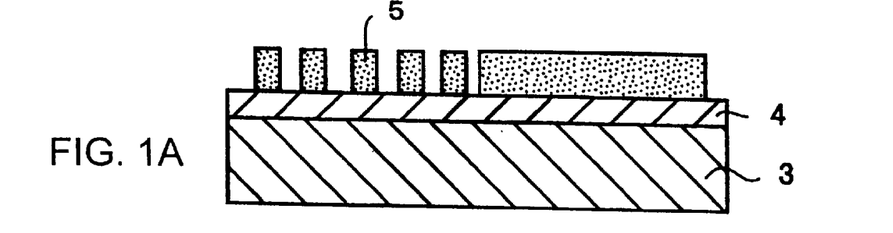
FIGS. 1A to 1F are cross sectional views illustrating a manufacturing method according to the first preferred embodiment of the present invention.
Figure 1B:
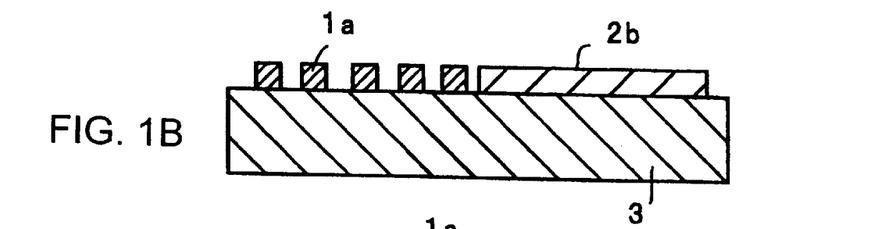
Figure 1C:
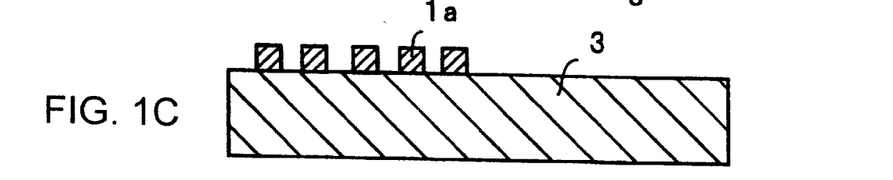
Figure 1D:
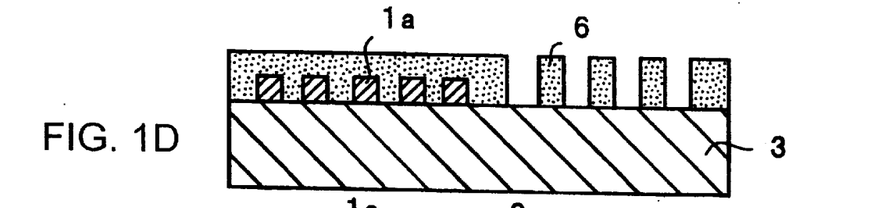
Figure 1E:
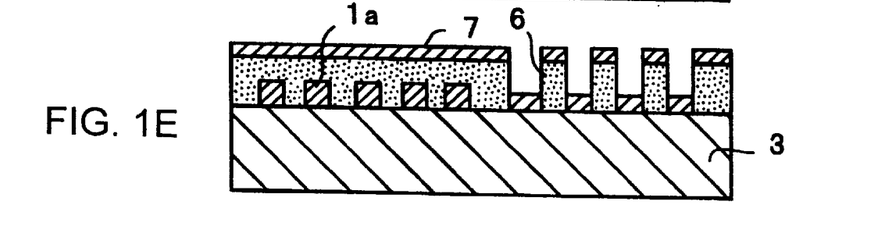
Figure 1F:
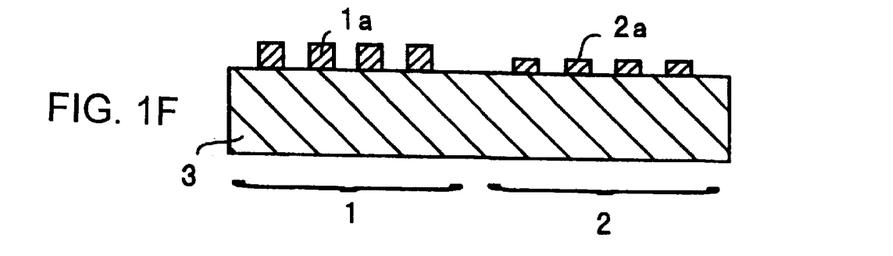

In the present preferred embodiment, the surface acoustic wave apparatus which is schematically shown in a cross sectional manner in FIG. 1F is manufactured. As shown in FIG. 1F, in this surface acoustic wave apparatus, a surface acoustic wave filter device 1 includes electrodes 1a and a second surface acoustic wave filter device 2 including electrodes 2a, wherein the surface acoustic wave devices 1 and 2 including the electrodes 1a and 2a are disposed on a common piezoelectric substrate 3.

Figure 2A:
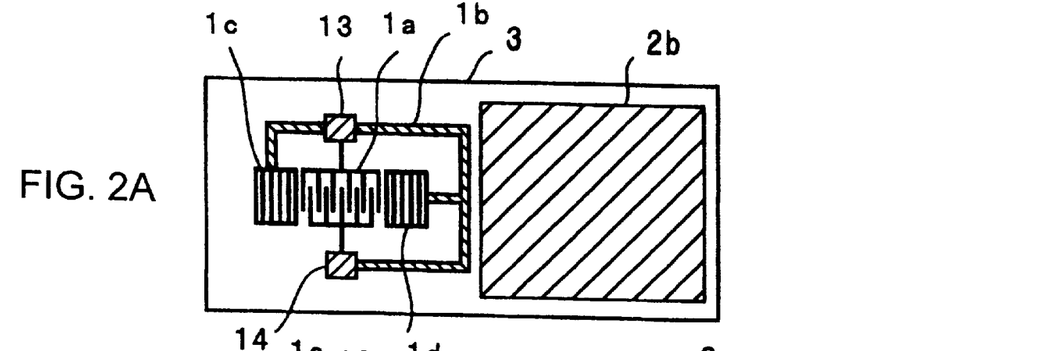
FIGS. 2A to 2D are plan views illustrating each step of the manufacturing method according to the first preferred embodiment of the present invention.
Figures 2B, 2C:
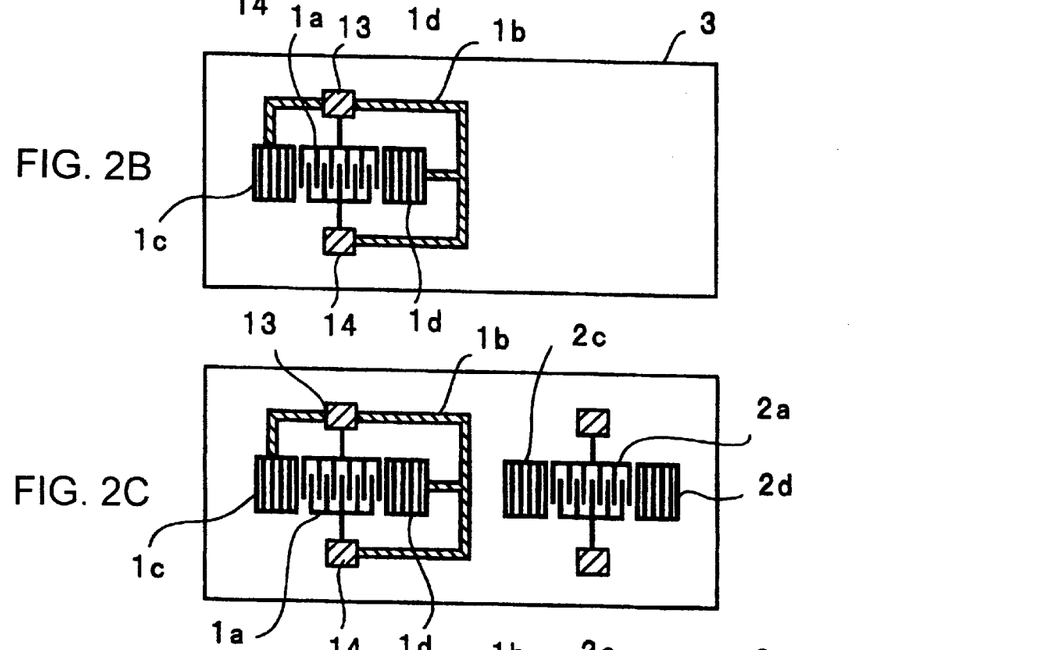
Figure 2D:
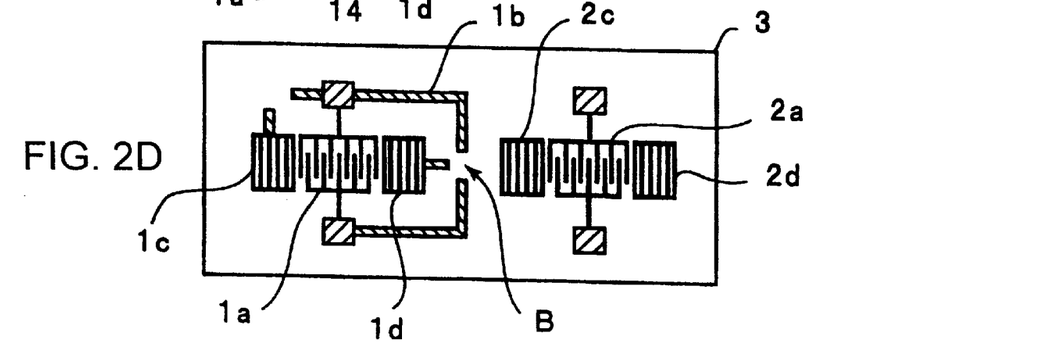

The surface acoustic wave filter devices 1 and 2, which are schematically shown in FIG. 1, preferably have substantially planar shapes shown in FIG. 2D. That is, the IDT electrodes 1a and reflectors 1c and 1d located at both ends of the propagation direction of a surface wave of the IDT electrodes 1a are disposed on the piezoelectric substrate 3, thereby defining the first surface acoustic filter device 1. The IDT electrodes 2a, and reflectors 2c and 2d arranged at both ends of the propagation direction of a surface wave of the IDT electrodes 2a are disposed on the piezoelectric substrate 3, thereby defining the second surface acoustic filter device.

The thickness of each of the IDT electrodes 1a is preferably thicker than the thickness of each of the IDT electrodes 2a.

The IDT electrodes 1a and 2a include a pair of comb-shaped electrodes which have electrode fingers that are interdigitated with each other. A wiring electrode 1b is disposed in the surface acoustic wave filter device 1. In FIG. 2D, the wiring electrode 1b is disconnected. In a state shown in FIG. 2C, as described below, the wiring electrode 1b is electrically connected to both of the comb-shaped electrodes of the IDT electrodes 1a and the reflectors.

Initially, as shown in FIG. 1A, a conductive film 4 having substantially the same film thickness as that of each of the IDT electrodes 1a of the first surface acoustic wave filter device 1 is formed on the entire surface of the piezoelectric substrate 3. The piezoelectric substrate 3 can be constructed of a piezoelectric single crystal, such as LiTaO$_3$, LiNbO$_3$, crystal, lithium tetraborate, or langasite, or piezoelectric ceramic such as lead zirconium titanate series ceramics.

Alternatively, the piezoelectric substrate 3 may be constructed by forming a piezoelectric thin film such as ZnO on an insulation substrate made of an insulating material such as alumina or other suitable material.

The conductive film 4 can be constructed using a conductive material such as Al. In order to form the conductive film 4, an appropriate method such as evaporation, sputtering, or plating can be used.

Next, a positive-type first photo-resist layer is formed on the entire top surface of the conductive film 4. The first photo-resist layer is exposed using a mask having a shielding portion that corresponds to the shape of each of the IDT electrodes 1a of the first surface acoustic wave filter device and the entire region of the second surface acoustic wave filter device 2 including a portion in which all electrodes including the reflectors of the second surface acoustic wave filter device 2 are formed. Thereafter, the exposed resist portion is removed.

As a result, as is shown in FIG. 1A, the resist 5 having patterning can be obtained. As is obvious from FIG. 1A, patterning is performed so that the resist 5 have a shape corresponding to a part in which the IDT electrodes 1a of the surface acoustic wave filter device 1 (see FIG. 1F) and the wiring electrode 1b are formed and so that the resist 5 remains in a region including the entire region having the electrodes of the acoustic wave filter device 2 formed thereon, as shown on the right part of FIG. 1A.

Next, etching is performed using etchant that can remove the conductive film 4 without affecting the resist 5. Thereafter, removing the resist 5 leads to formation of the IDT electrodes 1a, the wiring electrode 1b, and the conductive film 2b, as shown in FIG. 1B. FIG. 2A shows a plan view of this state.

As is obvious from FIG. 1B and FIG. 2A, subsequent to the above process, the IDT electrodes 1a of the first surface acoustic wave filter device 1, the reflectors 1c and 1d, and the wiring electrode 1b are formed. The conductive film 2b is formed on the entire region of the surface acoustic wave filter device 2 including a region in which the electrodes thereof are formed. The etching can be performed via dry etching using the plasma, such as F or Cl, or other suitable material.

When the etching is performed, a region in which the electrodes of the second surface acoustic wave filter device of the piezoelectric substrate 3 are formed is coated with the conductive film 2b. Accordingly, the portion of the top surface of the piezoelectric substrate 3 which is coated with the conductive film 2b is unlikely to be damaged when the dry etching is performed.

Next, a positive-type photo resist is deposited on the entire surface of the piezoelectric substrate 3. On the side in which the second surface acoustic wave filter device 2 is constructed, a mask in which a region corresponding to the conductive film 2b is set as an opening is laminated on the resist and is exposed. The exposed resist portion is removed and, moreover, the conductive film 2b is removed by wet etching. In addition, removal of the remained resist enables the conductive film 2b to be removed, as shown in FIG. 1C. Since, as described above, removal of the conductive film 2b is performed using the wet etching, the top surface of the piezoelectric substrate 3 is hardly damaged in the region in which the conductive film 2b is formed. FIG. 2B shows a plan view of this state.

Next, the positive-type second photo resist is deposited on the entire surface of the piezoelectric substrate 3. On the side in which the second surface acoustic wave filter device 2 is constructed, a mask in which electrode formed components such as the IDT electrodes or the reflectors are an opening part is laminated on the photo resist and is exposed. At this stage, adhesion and resistance to heat of the photo resist is greatly increased.

Since the wiring electrode 1b short-circuits a pair of comb-shaped electrodes of the IDT electrodes 1a, discharge does not occur between the comb-shaped electrodes of the IDT electrodes. Accordingly, damage to the IDT electrodes 1a and the resist is prevented.

More specifically, the wiring electrode 1b is connected to input/output pads 13 and 14 and the reflector 1d. Each of the input/output pads 13 and 14 is electrically connected to the corresponding comb-shaped electrodes of the IDT electrodes 1a.

Thereafter, the exposed resist portion is removed, whereby, as shown in FIG. 1D, a second photo resist 6 having patterning can be obtained. As is obvious from FIG. 1D, on the side of the first surface acoustic wave filter device 1, the IDT electrodes 1a, the wiring electrode 1b, and other elements are coated and protected by the photo resist 6 having patterning. On the side of the second surface acoustic wave filter device, the photo resist 6 having patterning is formed except the portion having the IDT electrodes 2a of the second surface acoustic wave filter device formed thereon.

Thereafter, as shown in FIG. 1E, a conductive film 7 is laminated on the entire surface of the photo resist 6 and preferably has substantially the same film thickness of each of the IDT electrodes 2a of the second surface acoustic wave filter device 2.

Next, the conductive film 7 deposited on the photo resist 6 is removed via lift-off along with the photo resist 6. This state is shown in a plan view of FIG. 2C.

As described above, on the second surface acoustic wave filter device 2 side, the IDT electrodes 2a, the reflectors 2c and 2d, and the input/output pads 23 and 24 are formed.

Next, as shown in FIG. 2D, the wiring electrode 1b is disconnected at a portion indicated by an arrow B. Thus, the surface acoustic wave filter apparatus according to the present preferred embodiment can be obtained, which is schematically shown in the cross-sectional view in FIG. 1F and which is shown in the plan view in FIG. 2D.

The wiring electrode 1b can be disconnected using the photo resist via a photolithography etching method or via a laser or other suitable method.

As described above, the first and second surface acoustic wave filters 1 and 2 including IDT electrodes with different thicknesses from each other are disposed on the same piezoelectric substrate 3.

Furthermore, in the manufacturing method according to the present preferred embodiment, when the electrodes 1a of the first surface acoustic wave filter device 1 are formed, the dry etching is preferably performed using the plasma. During this process, the region in which the second surface acoustic wave filter device is formed is coated with the conductive film 2b so as to be protected. Accordingly, degradation of the piezoelectric substrate hardly occurs.

In addition, in forming the first and second surface acoustic wave filters 1 and 2, initially, the IDT electrodes 1a of the first surface acoustic wave filter device are formed. The wiring electrode 1b causes a pair of comb-shaped electrodes and the reflectors of the IDT electrodes 1a to be electrically connected to each other and be short-circuit. Therefore, even though adhesion and resistance to heat are increased due to heating or other conditions, since discharging hardly occurs, disconnect or short circuit or other defects of the IDT electrodes 1a are reliably prevented.

Figure 3:
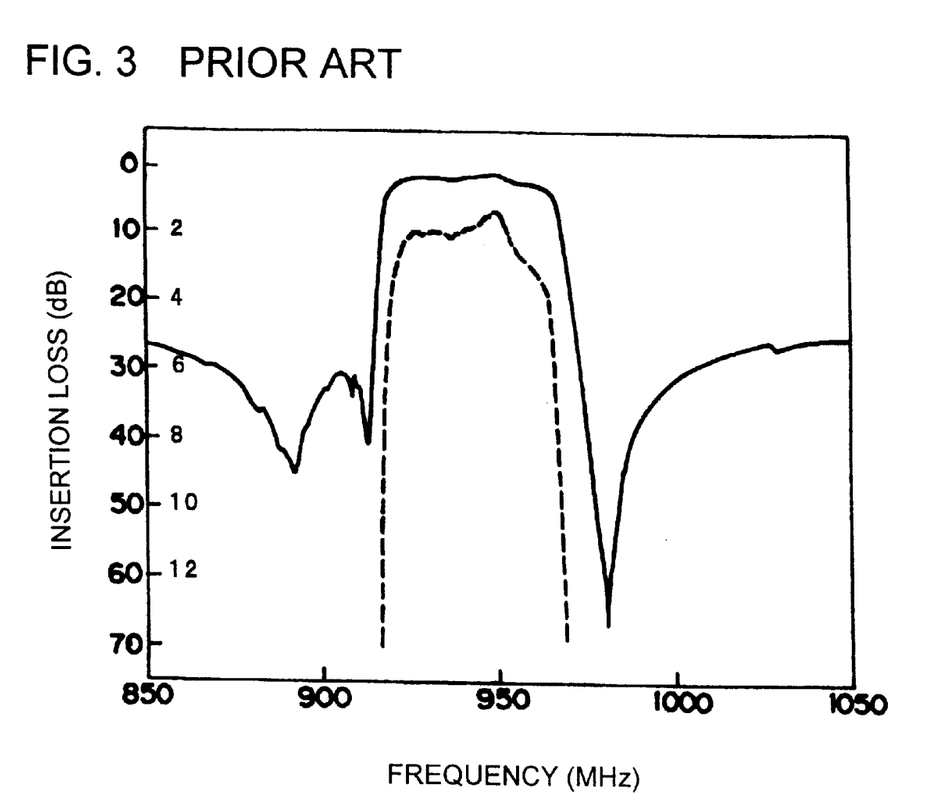
FIG. 3 is a graph illustrating the insertion loss-frequency characteristic of a second surface acoustic wave filter device of a surface acoustic wave apparatus obtained according to a conventional method.
Figure 4:
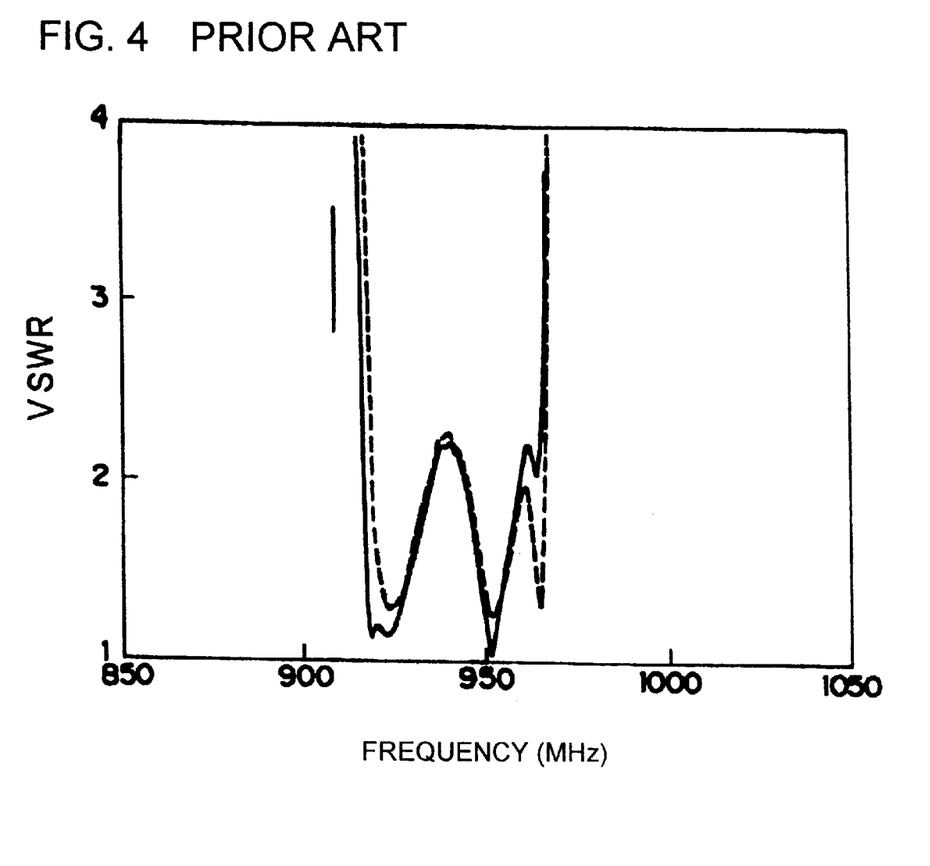
FIG. 4 is a graph illustrating the VSWR characteristic of the second acoustic wave filter device of the surface acoustic wave apparatus obtained using the conventional method.
Figure 5:
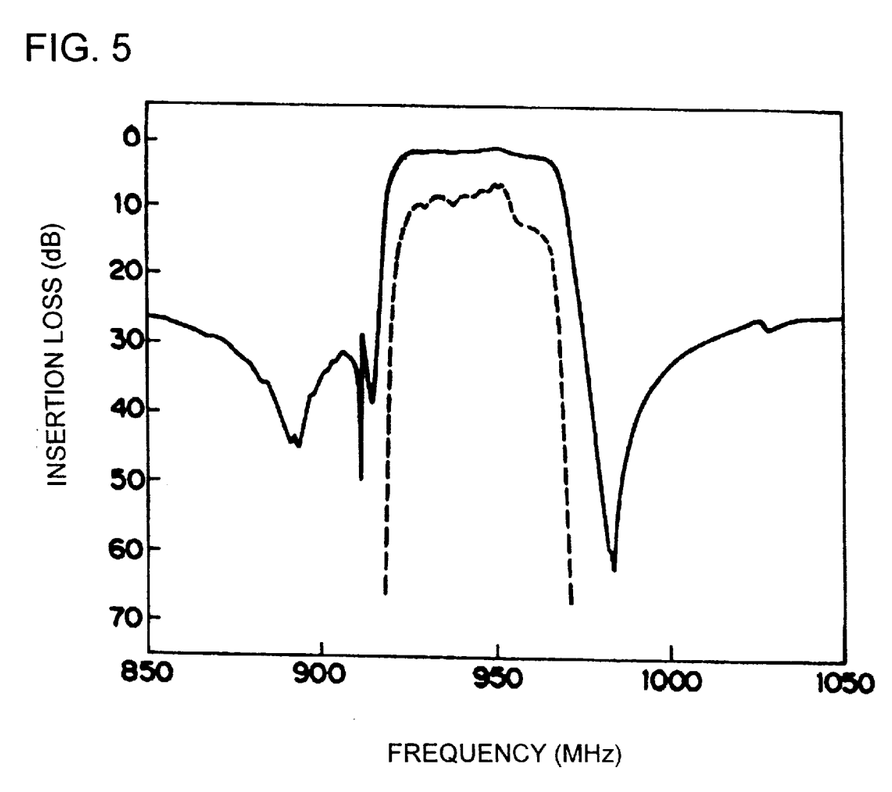
FIG. 5 is a graph illustrating the insertion loss-frequency characteristics of the second surface acoustic wave filter device of the surface acoustic wave apparatus according to the first preferred embodiment of the present invention.
Figure 6:
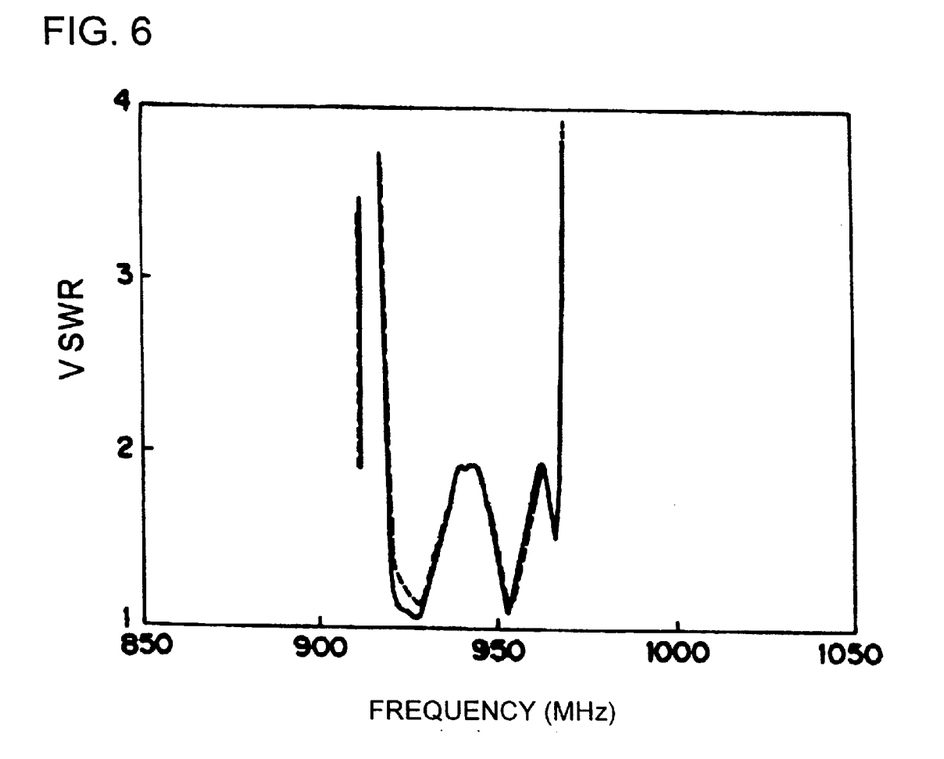
FIG. 6 is a graph illustrating the VSWR characteristic of the surface acoustic wave filter device of the surface acoustic wave apparatus according to the first preferred embodiment of the present invention.

As described above, the surface acoustic wave apparatus is obtained by forming the surface acoustic wave filter devices 1 and 2 having certain dimensions (e.g., 1.5 mm×2.1 mm×0.35 mm=1.10 mm$^3$) on the piezoelectric substrate 3. The amplitude characteristic and the reflection characteristic of the second surface acoustic wave filter device are measured. For comparison, in the surface acoustic wave apparatus obtained using the above-described conventional method, the amplitude characteristic and the reflection characteristic of the second surface acoustic wave filter device are measured. The results are shown in FIG. 3 to FIG. 6. The dashed lines in FIG. 3 and FIG. 5 represent characteristics expanded by the scales on the right hand of the vertical axis. In FIG. 4 and FIG. 6, the solid lines represent characteristics of the input port and the dashed lines represent characteristics of the output port.

FIG. 3 and FIG. 4 show the amplitude characteristic and the reflection characteristic of the second surface acoustic wave filter device of the surface acoustic wave apparatus obtained using the conventional method, the apparatus which is provided for comparison. FIG. 5 and FIG. 6 show the amplitude characteristic and the reflection characteristic of the second surface acoustic wave filter device of the surface acoustic wave apparatus obtained in the above-described preferred embodiment.

As is obvious from comparison of the results shown in FIG. 3, FIG. 4, FIG. 5, and FIG. 6, according to the manufacturing method of the present preferred embodiment, it is clear that insertion loss and VSWR are greatly improved. The results indicated in FIG. 3 to FIG. 6 are shown in the below table 1.

TABLE 1

|  | Conventional Method (Average/σ) | Present Preferred Embodiment (Average/σ) | Process Difference |
| --- | --- | --- | --- |
| Minimum Insertion Loss | 1.42 dB/0.06 | 1.27 dB/0.06 | 0.15 dB |
| VSWR | 2.30/0.11 | 1.87/0.05 | 0.43 |

FIGS. 7A to 7F are each cross-sectional views illustrating the manufacturing method of the surface acoustic wave apparatus according to a second preferred embodiment of the present invention. Elements that are identical to their counterparts in the first preferred embodiment are assigned to have the same reference numerals as those corresponding elements, and the detailed description of the identical elements is omitted.

In the second preferred embodiment, the surface acoustic wave apparatus having the same electrode construction as in the first preferred embodiment is manufactured.

Figure 7A:
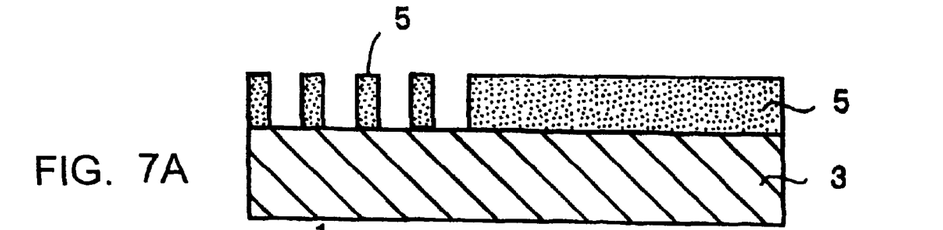
FIGS. 7A to 7F are of schematically cross sectional views each illustrating the manufacturing method according to the second preferred embodiment of the present invention.

Initially, a negative-type first photo resist is deposited on the entire top surface of the piezoelectric substrate. A mask in which a shielding portion is the portion in which the electrodes 1a of the first surface acoustic wave filter device 1 are formed is laminated on this resist layer and is exposed. Next, by removing the exposed resist portion, as shown in FIG. 7A, the resist 5 having the patterning is obtained. Patterning is performed so that this resist 5 does not exist at a portion in which the short-circuit wiring electrode 1b is provided. The resist 5 remains at a portion including the entirety of the region in which the electrodes of the second surface acoustic wave filter device are formed.

Figure 7B:
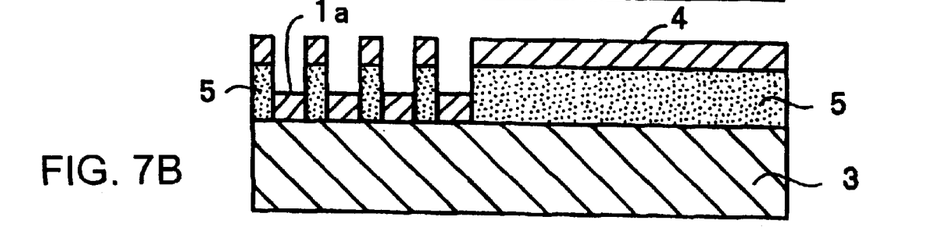

Next, a conductive film having substantially the same film thickness as those of the IDT electrodes 1a of the first surface acoustic wave filter device is formed on the entire surface of the piezoelectric substrate 3 (FIG. 7B).

Figure 7C:
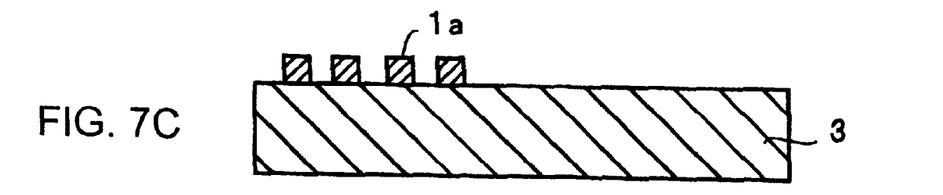

Thereafter, the conductive film 4 laminated on the resist 5 is removed via lift-off along with the resist 5, forming the IDT electrodes 1a as well as the wiring electrode 1b (FIG. 7C). In this case, although not shown in FIG. 7, the reflectors 1c and 1d shown in FIG. 2D are formed in the same manner. The electrode film is not formed in the region in which the second surface acoustic wave filter device 2 is constructed.

Since, as described above, the IDT electrodes 1a of the first surface acoustic wave filter device 1 and the wiring electrode 1b are formed using the lift-off method, the region in which the electrodes of the second surface acoustic wave filter device of the piezoelectric substrate 3 are formed is not subject to the dry etching, which eliminates any damage to the piezoelectric substrate 3.

Thereafter, the positive-type second photo resist is preferably deposited on the entire top surface of the piezoelectric substrate 3. Next, on the side in which the second surface acoustic wave filter device 2 is formed, the mask in which a pattern portion, such as each of the IDT electrodes 2a, or the reflector 2c or 2d, functions as the opening is laminated on the resist and is exposed. At this stage, heat treatment on the resist 6 greatly increases adhesion and resistance to heat thereof.

During the heating of this resist 6, since the electrodes on the side of the first surface acoustic wave filter device 1, such as the IDT electrodes 1a and the wiring electrode 1b, are coated with the resist 6, the top surface of the piezoelectric substrate 3 is hardly damaged on the side of the first surface acoustic wave filter device 1.

In the same manner as in the first preferred embodiment, since the wiring electrode 1b causes the input/output pads 13 and 14, and the reflectors 1c and 1d to be short-circuited, discharging is prevented from occurring during the heating. Accordingly, damage to the IDT electrodes 1a and to the resist 6 is prevented.

Figure 7D:
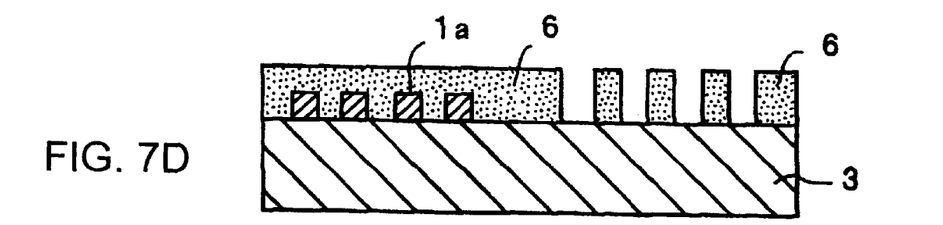

Thereafter, by removing the exposed resist, the resist 6 having patterning can be obtained as shown in FIG. 7D.

Figure 7E:
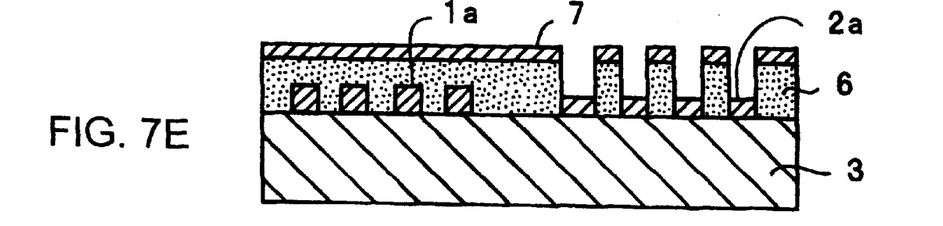
Figure 7F:
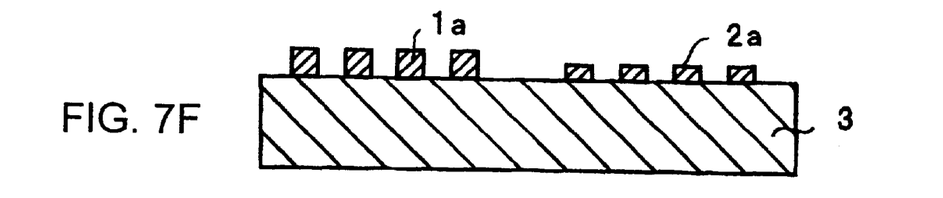

Next, the conductive film 7 preferably having substantially the same film thickness as the thickness of each of the IDT electrodes 2a of the second surface acoustic wave filter device is entirely deposited. In this case, due to deposition of the conductive film 7, the IDT electrodes 2a including the conductive film 7, and, though not shown in FIG. 7, the reflectors 2c and 2d, and the electrode pads 23 and 24 are formed in a region in which the resist 6 does not exist. Thus, the electrode construction on the side of the second surface acoustic wave filter device 2 is formed. Thereafter, by lifting off the resist 6 and the conductive film 7 on the resist 6, and disconnecting the wiring electrode 1b in the same manner as in the first preferred embodiment, the surface acoustic wave apparatus can be obtained.

In the second preferred embodiment, formation of the electrodes of the first surface acoustic wave filter device can be performed using the lift-off method. Therefore, during the process of forming the electrodes on the side of the first surface acoustic wave filter device, due to the dry etching or other suitable process, there is no risk of degrading the piezoelectric substrate portion on the side in which the second surface acoustic wave filter device is constructed. Accordingly, compared with the conventional method, degradation of the insertion loss or the VSWR can be prevented on the second surface acoustic wave filter device side.

Figure 8:
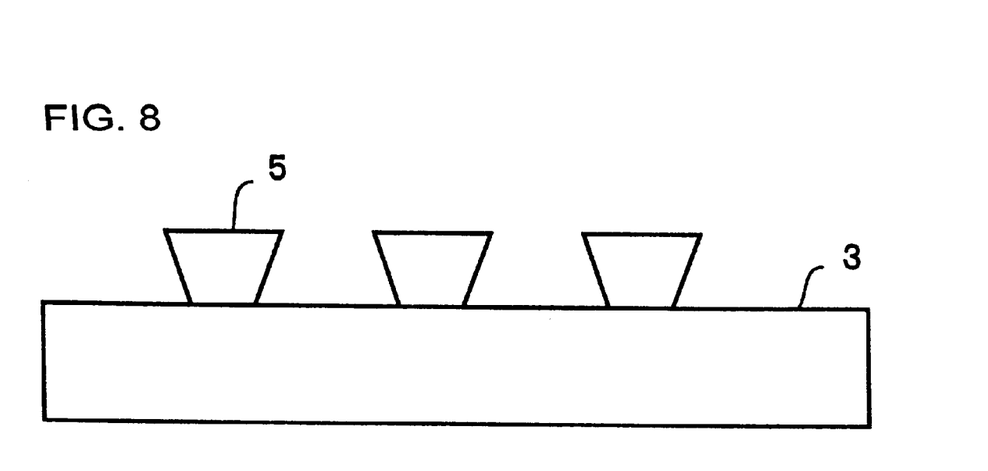
FIG. 8 is a schematically side view illustrating a preferable shape of a resist, in the second preferred embodiment, in a case in which the resist is formed.

In the manufacturing method according to the second preferred embodiment, preferably, by eliminating burrs at the edge portion of the IDT electrodes to improve the ease of lift-off, it is preferable that the resist 5 be constructed so as to have a reverse tapered cross section, as shown in FIG. 8A. That is, as the resist 5 moves closer to the piezoelectric substrate 3 side, the resist 5 is preferably formed so that the width of each of the electrode fingers expands.

In the manufacturing method according to the second preferred embodiment, dry etching is not required. Only execution of two-stage lift-off method is necessary. Accordingly, simplification of the processes can be achieved compared to the first preferred embodiment.

FIGS. 9A to 9E each are cross-sectional views illustrating a manufacturing method of the surface acoustic wave apparatus according to a third preferred embodiment of the present invention.

Elements that are identical to their counterparts in the first preferred embodiment are illustrated by the same reference numerals as those of the counterpart elements, and the detailed description thereof is omitted.

Figure 9A:
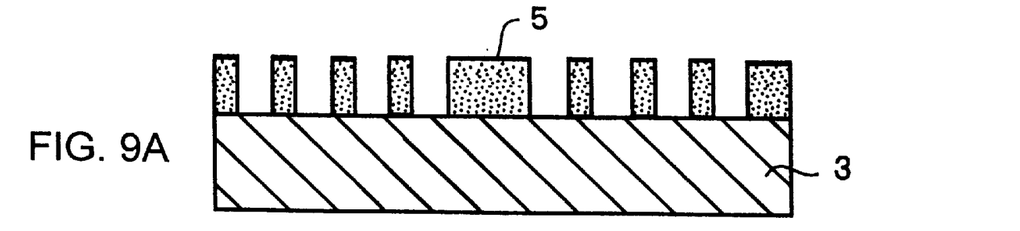
FIGS. 9A to 9E are schematically cross sectional views illustrating the manufacturing method according to the third preferred embodiment of the present invention.
Figure 9B:
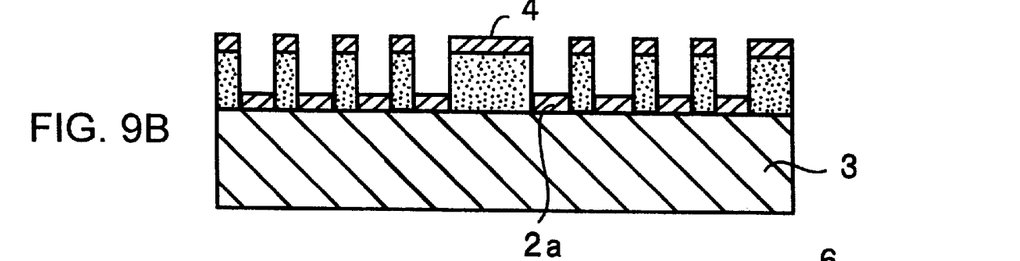
Figure 9C:
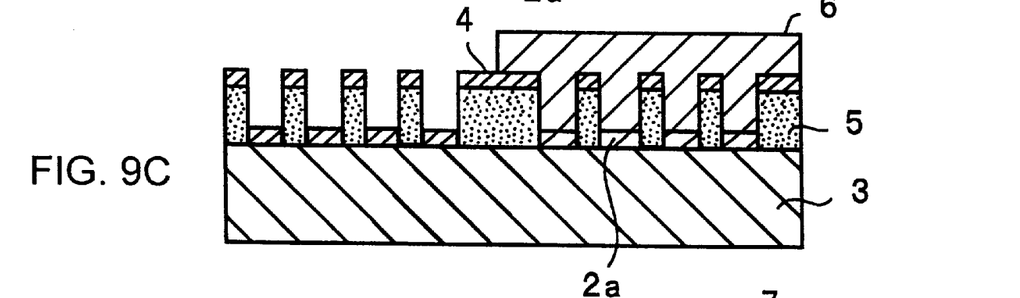
Figure 9D:
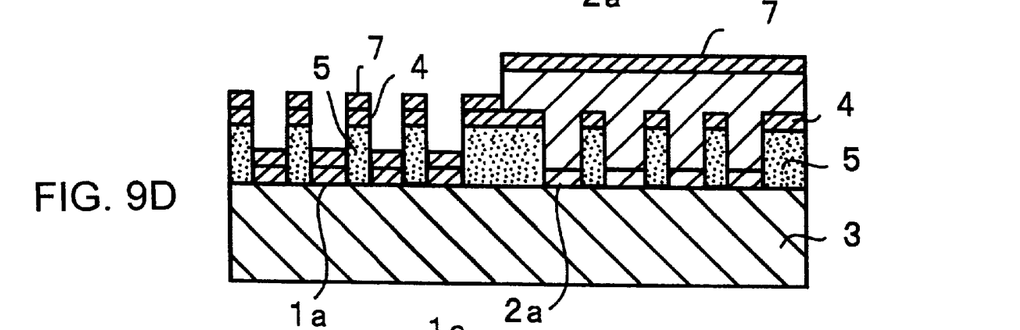
Figure 9E:
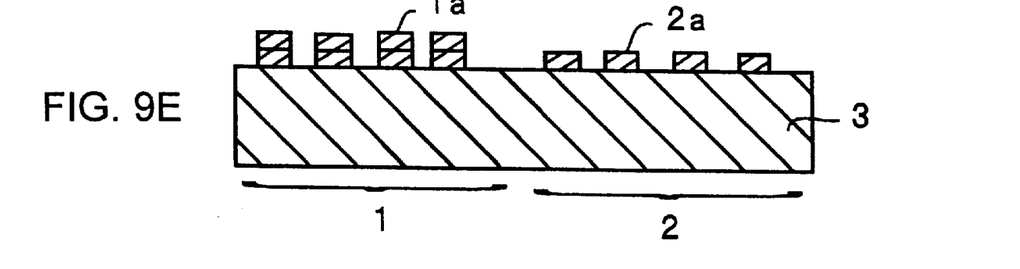

In the present preferred embodiment, as shown using the schematically cross sectional view in FIG. 9E, the first and second surface acoustic wave filter devices 1 and 2 are constructed on the piezoelectric substrate 3. The IDT electrodes 1a of the first surface acoustic wave filter device 1 have a construction in which a plurality of electrode films are laminated, whereby the electrode film of each of the IDT electrodes 1a of the first surface acoustic wave filter device 1 is preferably thicker than that of each of the IDT electrodes 2a of the second surface acoustic wave filter device 2.

Initially, a negative-type first resist is deposited on the entirety of the top face of the piezoelectric substrate 3. A mask, in which a shielding portion is a portion in which the IDT electrodes 1a of the first surface acoustic wave filter device 1, the IDT electrodes 2a of the second surface acoustic wave filter device, and the reflectors of these surface acoustic wave filter devices are formed, is laminated on this first resist and exposed. Thereafter, by removing the exposed first resist part, the first resist layer 5 having the patterning shown in FIG. 9A is obtained.

Next, the conductive film 4 having substantially the same film thickness as that of each of the IDT electrodes 2a of the second surface acoustic wave filter device 2 is formed on the entire surface of the piezoelectric substrate 3 (FIG. 9B).

Thereafter, the positive-type second resist is deposited on the entire surface of the piezoelectric substrate 3. Thereafter, a mask is laminated and exposed in which an opening portion is a region excluding a region in which the electrodes of the second surface acoustic wave filter device are provided and including a region in which at least the first surface acoustic wave filter device is formed. By removing the exposed resist portion, the second resist layer 6 having patterning is obtained (FIG. 9C).

Since patterning of this second resist layer 6 is not patterning for forming the IDT electrode portion, high accuracy may not be required.

As shown in FIG. 9C, the IDT electrodes 2a are protected by the second resist 6 on the second surface acoustic wave filter device 2 side.

Next, the second conductive film 7 is laminated on the entire surface of the conductive film 4. The thickness of the second conductive film 7 is preferably selected so that the total thickness of the second conductive film 7 and the conductive film 4 is substantially equal to the thickness of the IDT electrodes 1a of the first surface acoustic wave filter device, or that of the reflector 1c or 1d (FIG. 9D).

The number of laminated conductive films is not particularly limited. Other conductive films may also be formed on the conductive film 7.

Alternatively, an intermediate layer including Ti, NiCr, or other suitable material may be disposed between the conductive film 4 and the conductive film 7 in order to increase the adhesion thereof.

In either case, the total thickness of the laminated conductive films which may include an intermediate layer is preferably substantially equal to the thickness of the IDT electrodes 1a of the first surface acoustic wave filter device.

Thereafter, the conductive films 4 and 7 deposited on the first and second resists 5 and 6 are removed via lift off along with the first and second resists 5 and 6. In this manner, as shown in FIG. 9E, the IDT electrodes 1a of the first surface acoustic wave filter device 1 are formed. In this case, when lift-off is performed, a separating liquid functioning the positive-type resist as well as the negative-type resist is desired to be used in order to simplify the processes.

Although the first resist is the negative-type and the second resist is the positive-type, alternatively, the first resist can be the positive-type resist and the second resist can be the negative-type resist. In this case, when patterning is performed on the second resist, the region in which the electrodes of the first surface acoustic wave filter device 1 are formed is shielded with the mask, the exposure of the first resist is prevented, which prevents deformation of the first resist 5.

In the manufacturing method according to the present preferred embodiment, since formation of the electrodes of the first surface acoustic wave filter device is performed using the lift-off method, when the electrodes of the first surface acoustic wave filter device are formed, the region in which the piezoelectric substrate of the second surface acoustic wave filter device is formed is protected by the resist. Accordingly, compared with the conventional method in which formation of the first surface acoustic wave filter device is performed using the dry etching method, degradation of the insertion loss and VSWR of the second surface acoustic wave filter device 2 is prevented.

In addition, since, during the second photolithography process, only pattering is performed to protect the second surface acoustic wave filter device side, there is no need to increase the accuracy during the second photolithography process. Accordingly, the heating temperature of the resist 6 can be comparatively low so as to prevent pyroelectric destruction of the IDT electrodes. Therefore, although the wiring electrode is preferably formed and disconnected in the first and second preferred embodiments, there is no need to form such a short-circuit wiring electrode and thus, no need to execute the disconnecting process.

However, in the third preferred embodiment, in the same manner as in the first and second preferred embodiments, the process may be executed in which the short-circuit wiring electrode is formed and are finally disconnected.

Furthermore, in the manufacturing method according to the third preferred embodiment, since the resists on the electrode construction of the first and second surface acoustic wave filter devices and the conductive films thereon are simultaneously removed via lift-off, the processes can be simplified.

When the first resist 5 is the positive-type resist, deformation of the first resist is reliably prevented during patterning of the second resist by having the second resist be the negative-type.

While preferred embodiments of the present invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A method of manufacturing a surface acoustic wave apparatus including first and second surface acoustic wave devices having interdigital transducers with different thicknesses from each other on a single piezoelectric substrate, the method comprising the steps of:

providing a piezoelectric substrate;

forming a first conductive film on the entire surface of the piezoelectric substrate;

depositing a first resist on the entire surface of the first conductive film and patterning the first resist;

dry-etching the first conductive film using the patterned first resist to form on the piezoelectric substrate IDT electrodes of a first surface acoustic wave device, a short-circuit wiring electrode for establishing electrical connection between comb-shaped electrodes of the IDT electrodes, and a conductive film provided in a region including the entire area in which the second surface acoustic wave device is constructed;

removing the conductive film in the region including the entire area in which the second surface acoustic wave device is constructed;

depositing a second resist on the entire surface of the piezoelectric substrate and heating the second resist;

patterning the second resist at a portion in which the electrodes of the second surface acoustic wave device are formed;

forming on the entire surface of the piezoelectric substrate, a second conductive film having a thickness which is different from that of the first conductive film and having substantially the same film thickness as the electrode film thickness of the second surface acoustic wave device;

removing the second resist by a lift-off method to form the electrodes of the second surface acoustic wave device and to expose the electrodes of the first surface acoustic wave device; and disconnecting the short-circuit wiring electrode in the first surface acoustic wave device.

2. The method according to claim 1, wherein the step of removing the conductive film in the region including the entire area in which the second surface acoustic wave device is constructed is performed via wet etching.

3. The method according to claim 2, wherein the wet etching is performed using an etchant that can remove the conductive film without affecting the second resist.

4. The method according to claim 1, wherein the piezoelectric substrate is made of one of a piezoelectric single crystal, a piezoelectric ceramic, and an insulating substrate with a piezoelectric thin film disposed thereon.

5. A method according to claim 1, wherein the step of forming the first conductive film on the entire surface of the piezoelectric substrate is performed via one of evaporation, sputtering, and plating.

6. A method of manufacturing a surface acoustic wave apparatus including first and second surface acoustic wave devices having interdigital transducers with different thicknesses from each other on a single piezoelectric substrate, the method comprising the steps of:

providing a piezoelectric substrate;

depositing a first resist on the entire surface of the piezoelectric substrate;

removing the first resist at an area in which electrodes of the first surface acoustic wave device are to be formed and an area in which a wiring electrode for short-circuiting between the comb-shaped electrodes of the IDT electrodes of the first surface acoustic wave device is to be formed;

forming on the entire surface of the piezoelectric substrate a first conductive film having substantially the same film thickness as the electrode film thickness of the first surface acoustic wave device;

lifting off the first resist and the first conductive film deposited on the first resist so as to form the electrodes of the first surface acoustic wave device and the wiring electrode;

depositing a second resist on the entire surface of the piezoelectric substrate and heating the piezoelectric substrate;

removing the second resist at an area in which the electrodes of the second surface acoustic wave device are formed;

depositing on the entire surface of the piezoelectric surface a second conductive film having substantially the same film thickness as the electrode film thickness of the second surface acoustic wave device;

lifting off the second resist and the second conductive film deposited on the second resist so as to form the electrodes of the second surface acoustic wave device; and disconnecting the short-circuit wiring electrode in the first surface acoustic wave device.

7. The method according to claim 6, wherein the piezoelectric substrate is made of one of a piezoelectric single crystal, a piezoelectric ceramic, and an insulating substrate with a piezoelectric thin film disposed thereon.

8. A method according to claim 6, wherein after the step of removing the first resist at an area in which electrodes of the first surface acoustic wave device are to be formed and an area in which a wiring electrode for short-circuiting between the comb-shaped electrodes of the IDT electrodes of the first surface acoustic wave device is to be formed, the first resist remains at a portion including the entire area in which the electrodes of the second surface acoustic wave filter device are formed.

9. A method according to claim 6, wherein the first resist has a reverse tapered cross section.

10. A method of manufacturing a surface acoustic wave apparatus including first and second surface acoustic wave devices having interdigital transducers with different thicknesses from each other on a single piezoelectric substrate, the method comprising the steps of:

providing a piezoelectric substrate;

depositing a first resist on the entire surface of the piezoelectric substrate;

removing the first resist at an area in which electrodes of the first and second surface acoustic wave devices are to be formed;

forming on the entire surface of the piezoelectric substrate a first conductive film having substantially the same film thickness as the electrode film thickness of the second surface acoustic wave device;

depositing a second resist on the entire surface of the piezoelectric surface;

removing the second resist at an area in which at least the electrodes of the first surface acoustic wave device are formed, except a portion in which the second surface acoustic wave device is located;

depositing a second conductive film on the first conductive film using the first and second resists; and removing by a lift-off method, the first resist and the second resist to form interdigital transducers of the first and second surface acoustic wave devices.

11. The method according to claim 10, wherein the piezoelectric substrate is made of one of a piezoelectric single crystal, a piezoelectric ceramic, and an insulating substrate with a piezoelectric thin film disposed thereon.

12. A method according to claim 10, wherein the first resist is a negative-type resist.

13. A method according to claim 10, wherein the first resist is a positive-type resist, the second resist is a negative-type resist, and only one separating liquid is used for lifting off the first and second resists.

14. A method according to claim 10, further comprising the step of forming additional conductive films, in addition to the first and second conductive films, on the piezoelectric substrate.

15. A method according to claim 14, wherein the total thickness of all of the conductive films is substantially equal to the thickness of the IDT electrodes of the first surface acoustic wave filter device.

16. A method according to claim 10, further comprising the step of forming an intermediate layer between the first conductive film and the second conductive film.

17. A method according to claim 14, wherein the total thickness of the first and second conductive films and the intermediate layer is substantially equal to the thickness of the IDT electrodes of the first surface acoustic wave filter device.

* * * * *